(12) United States Patent
Guler et al.

(10) Patent No.: US 11,594,637 B2
(45) Date of Patent: Feb. 28, 2023

(54) GATE-ALL-AROUND INTEGRATED CIRCUIT STRUCTURES HAVING FIN STACK ISOLATION

(71) Applicant: Intel Corporation, Santa Clara, CA (US)

(72) Inventors: Leonard P. Guler, Hillsboro, OR (US); Stephen Snyder, Portland, OR (US); Biswajeet Guha, Hillsboro, OR (US); William Hsu, Hillsboro, OR (US); Urusa Alaan, Hillsboro, OR (US); Tahir Ghani, Portland, OR (US); Michael K. Harper, Hillsboro, OR (US); Vivek Thirtha, Portland, OR (US); Shu Zhou, Portland, OR (US); Nitesh Kumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/833,208

(22) Filed: Mar. 27, 2020

(65) Prior Publication Data

US 2021/0305430 A1    Sep. 30, 2021

(51) Int. Cl.
*H01L 29/78*    (2006.01)
*H01L 29/06*    (2006.01)
(Continued)

(52) U.S. Cl.
CPC ........ *H01L 29/7856* (2013.01); *H01L 21/022* (2013.01); *H01L 21/02293* (2013.01);
(Continued)

(58) Field of Classification Search
CPC ....... H01L 21/823431; H01L 21/76224; H01L 21/76227–76229; H01L 21/823481;
(Continued)

(56) References Cited

U.S. PATENT DOCUMENTS 8,450,813 B2 *   5/2013   Luo ................... H01L 29/7851
                                                 257/E29.264
8,466,028 B2 *   6/2013   Yin .................. H01L 29/66795
                                                      438/283
(Continued)

FOREIGN PATENT DOCUMENTS

CN         103915504 A  *  7/2014  ......... H01L 29/1083

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

Gate-all-around integrated circuit structures having fin stack isolation, and methods of fabricating gate-all-around integrated circuit structures having fin stack isolation, are described. For example, an integrated circuit structure includes a sub-fin structure on a substrate, the sub-fin structure having a top and sidewalls. An isolation structure is on the top and along the sidewalls of the sub-fin structure. The isolation structure includes a first dielectric material surrounding regions of a second dielectric material. A vertical arrangement of horizontal nanowires is on a portion of the isolation structure on the top surface of the sub-fin structure.

13 Claims, 18 Drawing Sheets

(51) Int. Cl.
*H01L 29/08* (2006.01)
*H01L 29/423* (2006.01)
*H01L 29/786* (2006.01)
*H01L 29/165* (2006.01)
*H01L 21/02* (2006.01)
*H01L 29/10* (2006.01)

(52) U.S. Cl.
CPC ...... *H01L 29/0649* (2013.01); *H01L 29/0673* (2013.01); *H01L 29/0847* (2013.01); *H01L 29/1091* (2013.01); *H01L 29/165* (2013.01); *H01L 29/42392* (2013.01); *H01L 29/7851* (2013.01); *H01L 29/78696* (2013.01)

(58) Field of Classification Search
CPC ......... H01L 29/66795; H01L 29/42392; H01L 29/0673; H01L 29/78696; H01L 29/66439; H01L 29/775; H01L 29/785–7856; H01L 29/0649–0653; H01L 27/0886; H01L 27/1211
See application file for complete search history.

(56) References Cited

U.S. PATENT DOCUMENTS

| | | | | |
|---|---|---|---|---|
| 10,373,977 B2* | 8/2019 | Glass | .................... | H01L 29/161 |
| 2009/0278196 A1* | 11/2009 | Chang | ............. | H01L 21/823412 |
| | | | | 438/440 |
| 2011/0147697 A1* | 6/2011 | Shah | .................... | H01L 29/775 |
| | | | | 977/762 |
| 2014/0061862 A1* | 3/2014 | Vega | ................. | H01L 29/66795 |
| | | | | 438/479 |
| 2014/0124863 A1* | 5/2014 | Cheng | ................. | H01L 27/1211 |
| | | | | 257/350 |
| 2014/0231919 A1* | 8/2014 | Peng | ..................... | H01L 21/845 |
| | | | | 257/368 |
| 2014/0332861 A1* | 11/2014 | Cheng | ................. | H01L 27/1211 |
| | | | | 257/288 |
| 2015/0137263 A1* | 5/2015 | Lee | ................... | H01L 21/02233 |
| | | | | 257/401 |
| 2015/0340490 A1* | 11/2015 | An | ........................ | H01L 29/785 |
| | | | | 257/401 |
| 2016/0013186 A1* | 1/2016 | Bae | ....................... | H01L 29/785 |
| | | | | 257/401 |
| 2016/0225677 A1* | 8/2016 | Jacob | ................ | H01L 21/02255 |
| 2016/0308012 A1* | 10/2016 | Song | ................ | H01L 21/823431 |
| 2016/0351591 A1* | 12/2016 | Xie | ....................... | H01L 21/0214 |
| 2017/0005195 A1* | 1/2017 | Ching | ................... | H01L 29/165 |
| 2017/0250290 A1* | 8/2017 | Chang | ............... | H01L 21/31111 |
| 2018/0130802 A1* | 5/2018 | Wang | .................. | H01L 27/0928 |
| 2018/0151677 A1* | 5/2018 | Glass | ................. | H01L 29/42392 |
| 2019/0006391 A1* | 1/2019 | Shen | ................. | H01L 21/76283 |
| 2019/0103317 A1* | 4/2019 | Yu | ....................... | H01L 29/78696 |
| 2019/0165145 A1* | 5/2019 | Ghani | ............... | H01L 21/02532 |
| 2020/0135725 A1* | 4/2020 | Wu | ................. | H01L 21/823481 |
| 2020/0227570 A1* | 7/2020 | Chen | .................... | H01L 29/785 |
| 2020/0357703 A1* | 11/2020 | Lee | ................... | H01L 21/76832 |
| 2021/0226020 A1* | 7/2021 | Lin | ....................... | H01L 29/045 |

* cited by examiner

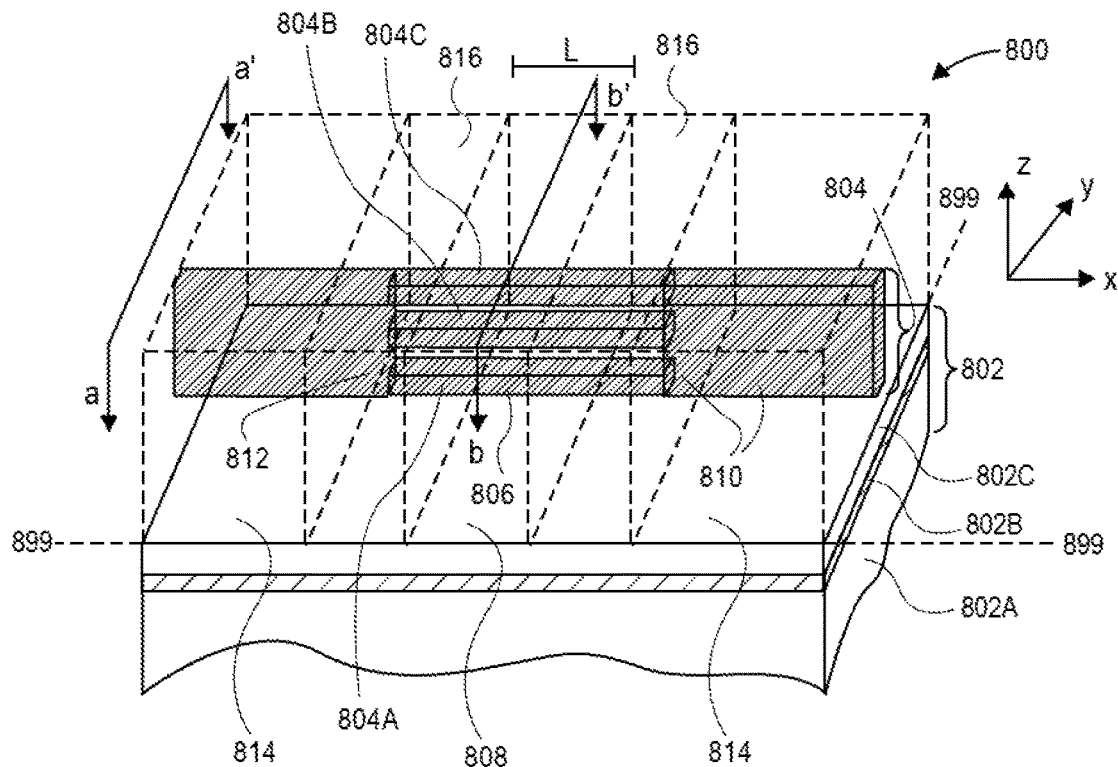
FIG. 8A
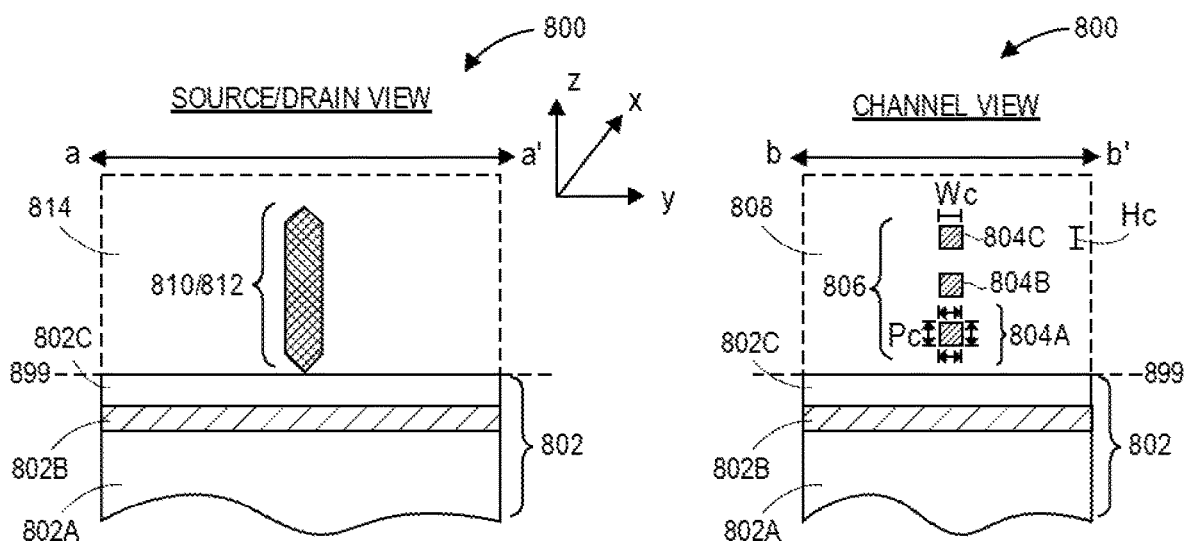
FIG. 8B   FIG. 8C

GATE-ALL-AROUND INTEGRATED CIRCUIT STRUCTURES HAVING FIN STACK ISOLATION

TECHNICAL FIELD

Embodiments of the disclosure are in the field of integrated circuit structures and processing and, in particular, gate-all-around integrated circuit structures having fin stack isolation, and methods of fabricating gate-all-around integrated circuit structures having fin stack isolation.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along an a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1A:
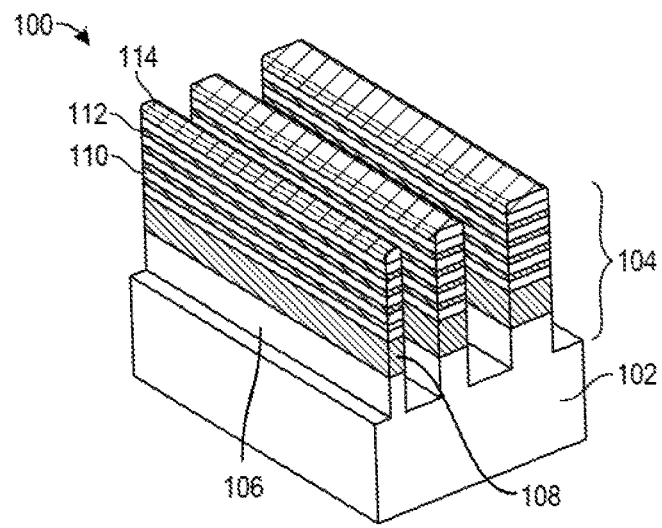
FIGS. 1A-1Q illustrate cross-sectional views representing various operations in a method of fabricating a gate-all-around integrated circuit structure having fin stack isolation, in accordance with an embodiment of the present disclosure.

Gate-all-around integrated circuit structures having fin stack isolation, and methods of fabricating gate-all-around integrated circuit structures having fin stack isolation, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to fin stack isolation, or local isolation, schemes for nanowire (NW) and/or nanoribbon (NR) transistors. Embodiments may be implemented to provide gate-all-around fin stack isolation prior to gate stack patterning, with some embodiments enabling a self-aligned gate endcap (SAGE) architecture. Embodiments with reference to a nanowire may encompass wires nanowires sized as wires or ribbons, unless specifically stated for nanowire-only dimensions.

To provide further context, state-of-the-art solutions for blocking or inhibiting source to drain leakage through semiconductor structures (such as sub-fin structures) beneath a nanowire device include sub-fin doping and/or physically increasing a gap between nanowires/nanoribbons and the underlying substrate structure. Both approaches, however, are associated with added process complexity and/or only minimal benefit.

In a first aspect, approaches described herein involve anchoring fins and then selectively removing a very bottom SiGe layer release layer in order to isolate a wire or ribbon stack from a substrate or a sub-fin of the substrate. Advantages to implementing such an approach can include shorter fin height requirements, larger recess process window (e.g., taller bottom SiGe can be used), and more space provided for a thicker liner layer.

In a second aspect, approaches described herein enable use of SAGE architecture with gate-all-around (GAA) architecture. Following anchoring of fins and then selective removal of the very bottom SiGe layer, a SAGE wall formation process to is performed to generate a SAGE wall around the isolated wire or ribbon stack.

Figure 1B:
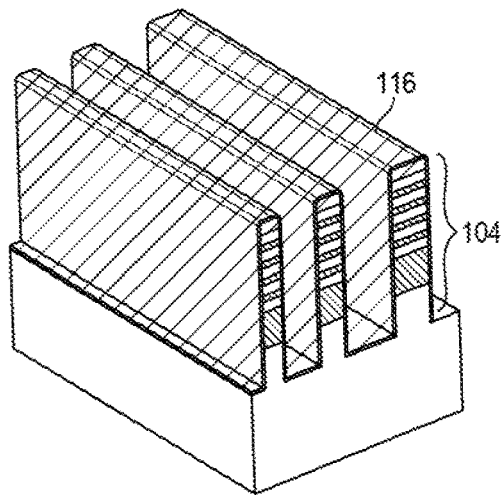
Figure 1C:
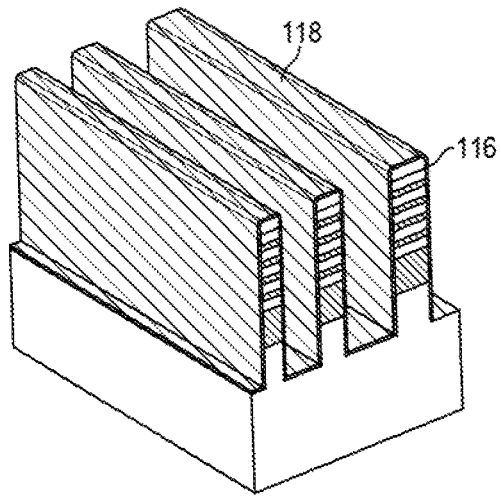
Figure 1D:
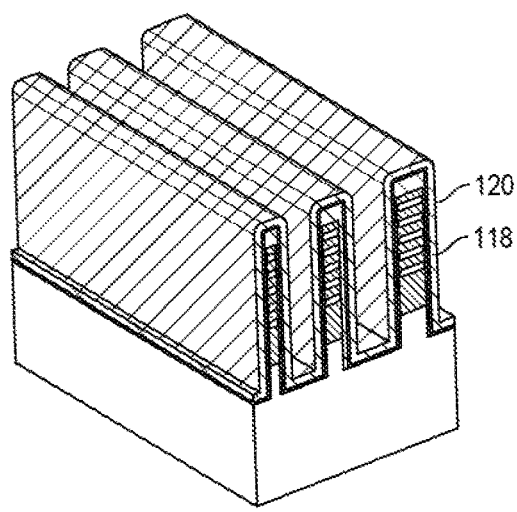
Figure 1E:
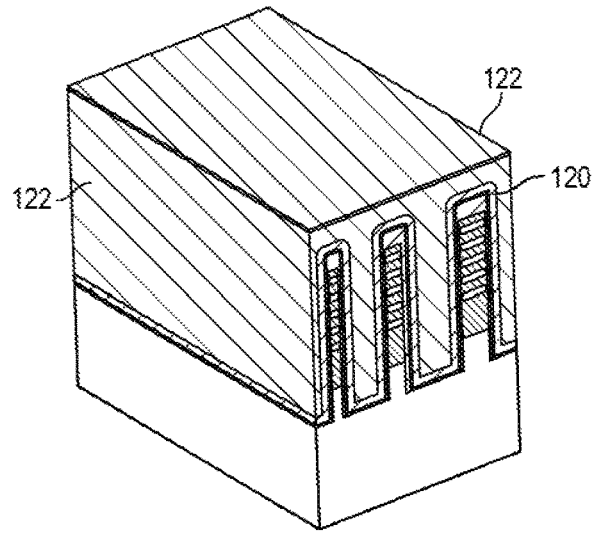
Figure 1F:
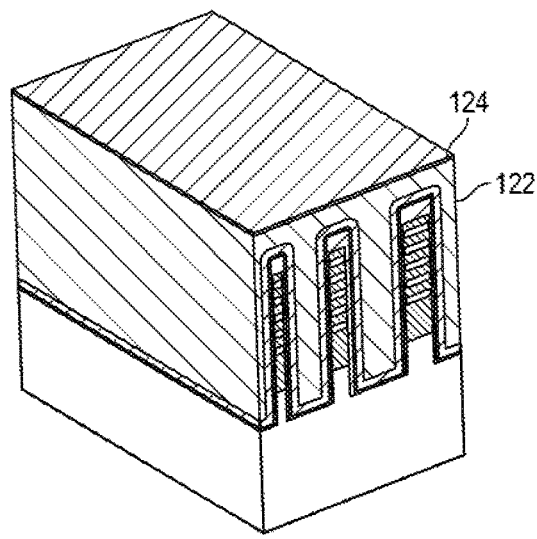
Figure 1G:
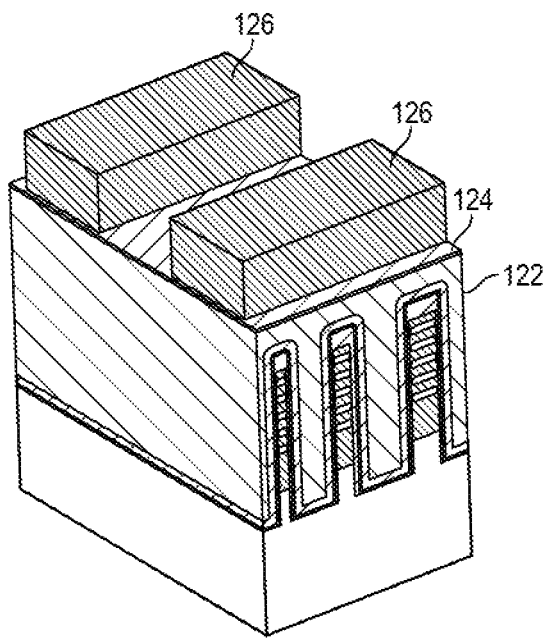
Figure 1H:
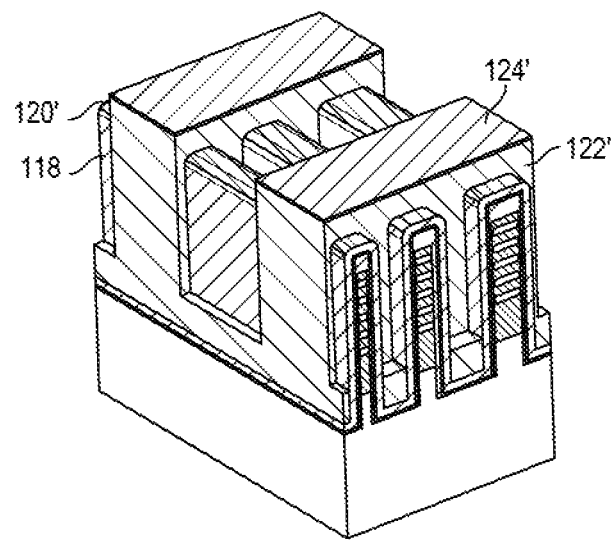
Figure 1I:
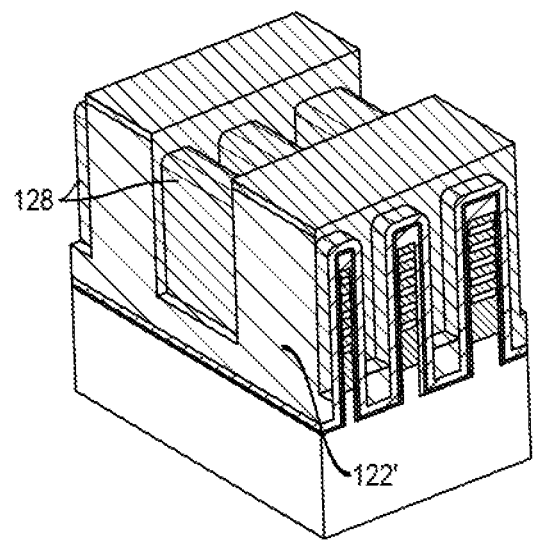
Figure 1J:
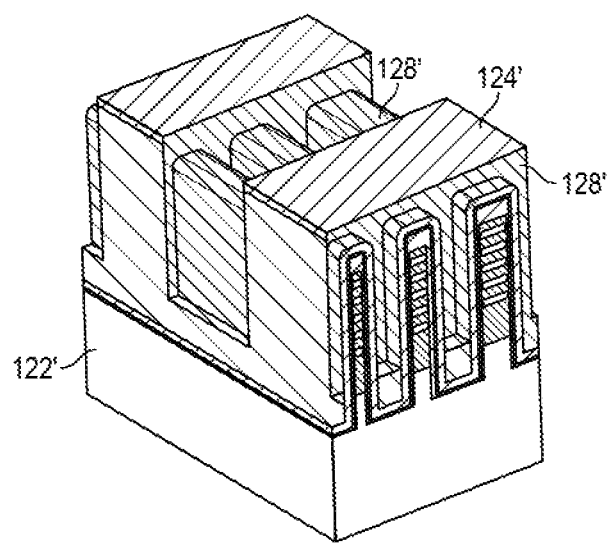
Figure 1K:
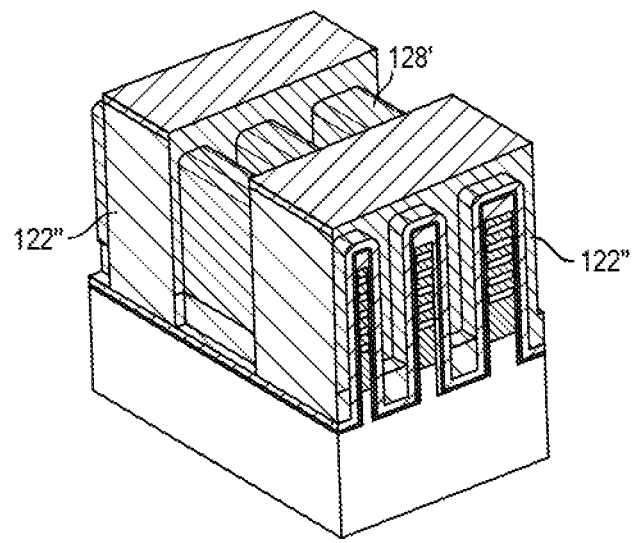
Figure 1L:
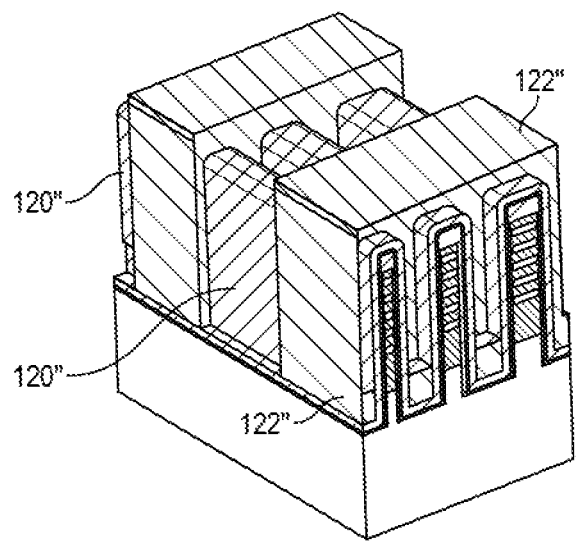
Figure 1M:
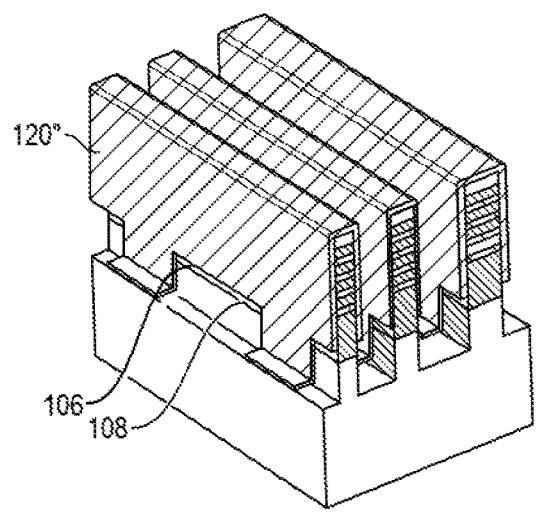
Figure 1N:
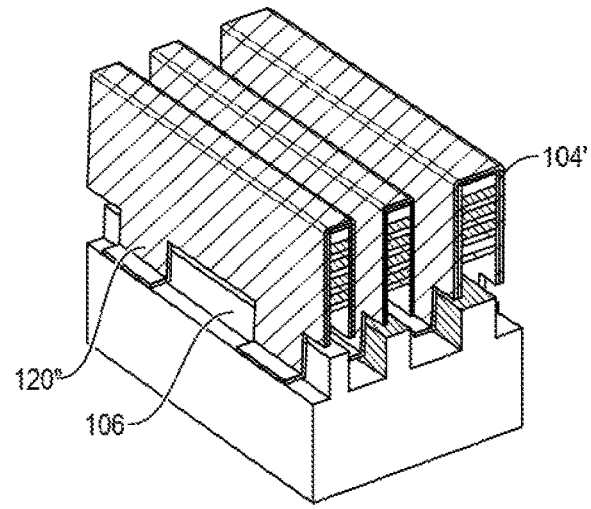
Figure 1O:
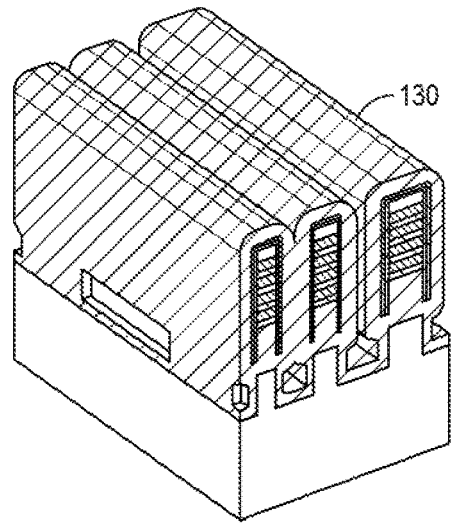
Figure 1P:
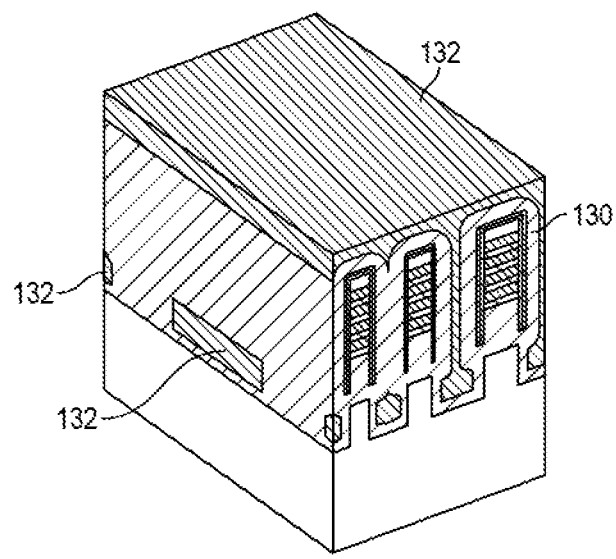
Figure 1Q:
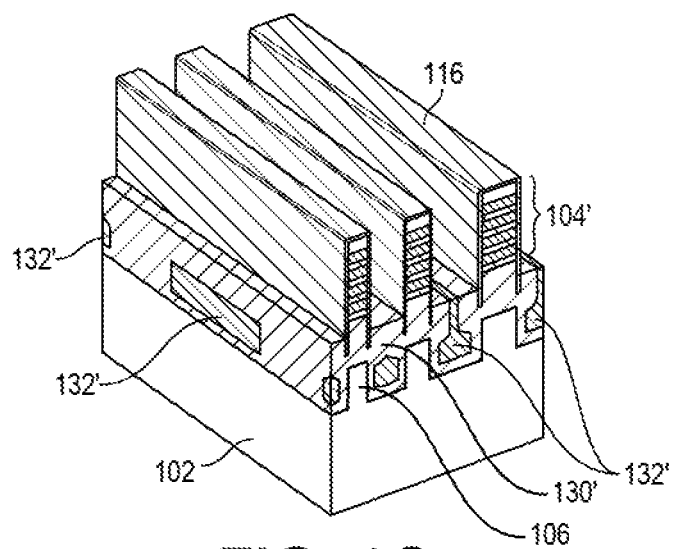

As a first exemplary process flow for fabricating a gate-all-around device with local isolation, FIGS. 1A-1Q illustrate cross-sectional views representing various operations in a method of fabricating a gate-all-around integrated circuit structure having fin stack isolation, in accordance with an embodiment of the present disclosure.

Referring to FIG. 1A, a starting stack 100 includes a fin structure 104 above a substrate 102, such as a silicon substrate. The fin structure 104 is above a sub-fin structure 106, such as a silicon sub-fin structure which may be continuous with the substrate 102. In one embodiment, the fin structure 104 includes alternating nanowire layers 110 (such as silicon nanowire layers) and release or sacrificial layers 112 (such as silicon germanium layers) on a lowermost release or sacrificial layer 108 (such as a silicon germanium layer which may be thicker than each of the release or sacrificial layers 112). A dielectric cap 114 may be included with the fin structure 104. The structure may be fabricated by etching blanket layers using a fin patterning mask.

Referring to FIG. 1B, a first dielectric liner 116 is formed over the structure of FIG. 1A. A second dielectric liner 118 is formed over the first dielectric liner 116, as is depicted in FIG. 1C.

Referring to FIG. 1D, a third dielectric liner 120 is formed over the second dielectric liner 118. A sacrificial hardmask material 122, such as a carbon hardmask material, is formed over the structure of FIG. 1D, as is depicted in FIG. 1E.

Referring to FIG. 1F, a dielectric cap 124, such as a silicon oxide or dioxide cap, is formed over the sacrificial hardmask material 122. A grating mask 126 is then formed on dielectric cap 124 by lithographic patterning, as is depicted in FIG. 1G.

Referring to FIG. 1H, the grating mask 126 is used in an etch process to pattern the dielectric cap 124, the sacrificial hardmask material 122 and the third dielectric liner 120 to form patterned dielectric cap 124', patterned sacrificial hardmask material 122' and patterned third dielectric liner 120', and to re-expose portions of the second dielectric liner 118. A liner 128, such as a titanium nitride liner, is then formed on the structure of FIG. 1H, as is depicted in FIG. 1I.

Referring to FIG. 1J, a liner break-through etch of liner 128, such as a titanium nitride liner break-through etch, is used to form patterned liner 128'. Using the patterned liner 128' as a mask, the patterned sacrificial hardmask material 122' is then etched to form twice patterned sacrificial hardmask material 122", as is depicted in FIG. 1K.

Referring to FIG. 1L, twice patterned sacrificial hardmask material 122" is used as a mask in an etch process to further pattern patterned third dielectric liner 120' to form twice patterned third dielectric liner 120". Twice patterned third dielectric liner 120" is then used as a mask in an etch process to remove exposed portions of first dielectric liner 116 and second dielectric liner 118 and to expose lowermost release or sacrificial layer 108 and sub-fin structure 106, as is depicted in FIG. 1M.

Referring to FIG. 1N, lowermost release or sacrificial layer 108 is selectively removed from the structure of FIG. 1M, e.g., by a selective wet etch process, to form a modified fin stack 104'. A dielectric material 130, such as a silicon oxide material which may be formed by an atomic layer deposition process, is formed over the structure of FIG. 1N, as is depicted in FIG. 1O.

Referring to FIG. 1P, a dielectric fill material 132, such as a silicon oxide material, is formed over the structure of FIG. 1O and fills any cavities or openings in the dielectric material 130. The dielectric material 130 and the dielectric fill material 132 are then recessed to form recessed dielectric material 130' and recessed dielectric fill material 132', as is depicted in FIG. 1Q. In one embodiment, the first dielectric liner 116 is re-exposed during the recessing, as is depicted.

In an embodiment, the recessed dielectric material 130' and recessed dielectric fill material 132' provide a local isolation structure to isolate modified fin stack 104' from sub-fin structure 106. At this stage, with modified fin stack 104' isolated from sub-fin structure 106, subsequent processing can include removal of remaining dielectric liners from the modified fin stack 104', release of nanowires from the modified fin stack 104', and formation of gate structures over the resulting nanowires, exemplary processes for which are described below.

With reference again to FIG. 1Q, in accordance with an embodiment of the present disclosure, an integrated circuit structure includes a sub-fin structure 106 on a substrate 102, the sub-fin structure 106 having a top and sidewalls. An isolation structure is on the top and along the sidewalls of the sub-fin structure 106. The isolation structure includes a first dielectric material 130' surrounding regions of a second dielectric material 132'. A vertical arrangement of horizontal nanowires (nanowires of modified fin stack 104') is on a portion of the isolation structure on the top surface of the sub-fin structure 106.

In an embodiment, a portion of the isolation structure along the sidewalls of the sub-fin structure 106 has a top surface above a top surface of the portion of the isolation structure on the top surface of the sub-fin structure 106, as is depicted in FIG. 1Q. In another embodiment, a portion of the isolation structure along the sidewalls of the sub-fin structure 106 has a top surface co-planar with a top surface of the portion of the isolation structure on the top surface of the sub-fin structure 106. In another embodiment, a portion of the isolation structure along the sidewalls of the sub-fin structure 106 has a top surface below a top surface of the portion of the isolation structure on the top surface of the sub-fin structure 106.

In an embodiment, the integrated circuit structure further includes a gate stack surrounding a channel region of the vertical arrangement of horizontal nanowires, exemplary structures of which are described in greater detail below. In one such embodiment, the gate stack includes a high-k gate dielectric layer and a metal gate electrode.

In an embodiment, the integrated circuit structure further includes a pair of non-discrete epitaxial source or drain structures at first and second ends of the vertical arrangement of horizontal nanowires, exemplary structures of which are described in greater detail below. In another embodiment, the integrated circuit structure further includes a pair of discrete epitaxial source or drain structures at first and second ends of the vertical arrangement of horizontal nanowires, exemplary structures of which are described in greater detail below.

As a second exemplary process flow for fabricating a gate-all-around device with local isolation, FIGS. 2A-2K illustrate cross-sectional views representing various operations in another method of fabricating a gate-all-around integrated circuit structure having fin stack isolation, in accordance with another embodiment of the present disclosure.

Figure 2A:
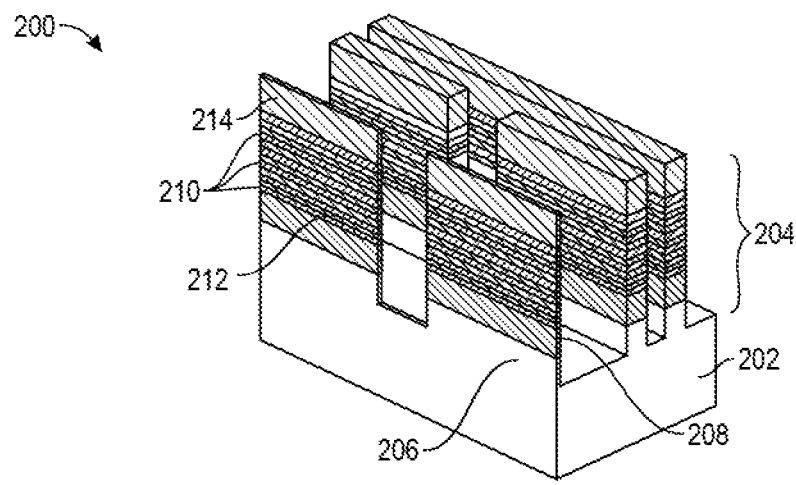
FIGS. 2A-2K illustrate cross-sectional views representing various operations in another method of fabricating a gate-all-around integrated circuit structure having fin stack isolation, in accordance with another embodiment of the present disclosure.

Referring to FIG. 2A, a starting stack 200 includes a fin structure 204 above a substrate 202, such as a silicon substrate. The fin structure 204 is above a sub-fin structure 206, such as a silicon sub-fin structure which may be continuous with the substrate 202. In one embodiment, the fin structure 204 includes alternating nanowire layers 210 (such as silicon nanowire layers) and release or sacrificial layers 212 (such as silicon germanium layers) on a lowermost release or sacrificial layer 208 (such as a silicon germanium layer which may be thicker than each of the release or sacrificial layers 212). A dielectric cap 214 may be included with the fin structure 204. The structure may be fabricated by etching blanket layers using a fin patterning mask.

Figure 2B:
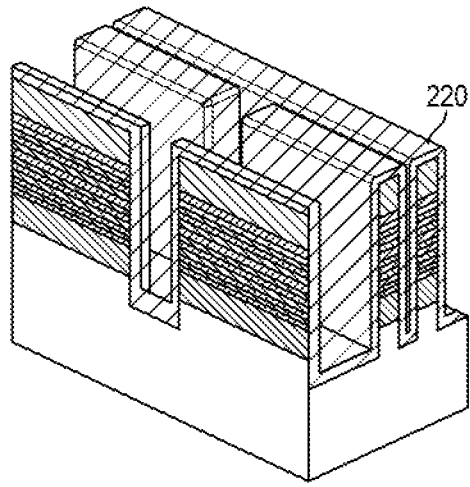
Figure 2C:
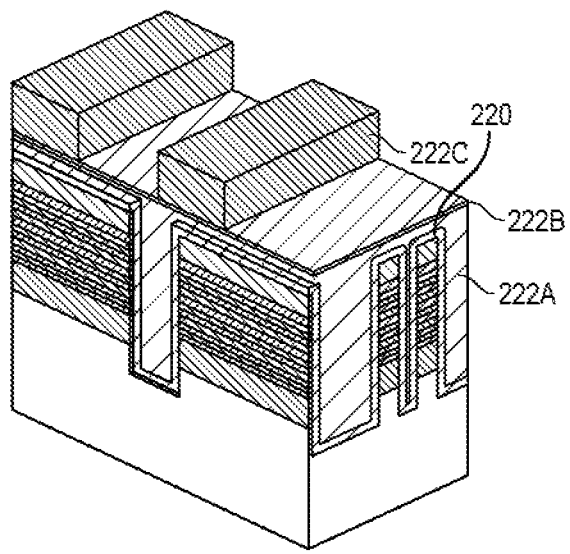

Referring to FIG. 2B, a spacer dielectric 220 is formed over the structure of FIG. 2A. A sacrificial hardmask material 222A, such as a carbon hardmask material, is formed over the structure of FIG. 2B. A dielectric cap 222B, such as a silicon oxide or dioxide cap, is formed over the sacrificial hardmask material 222A. A grating mask 222C is then formed on dielectric cap 222B by lithographic patterning, as is depicted in FIG. 2C.

Figure 2D:
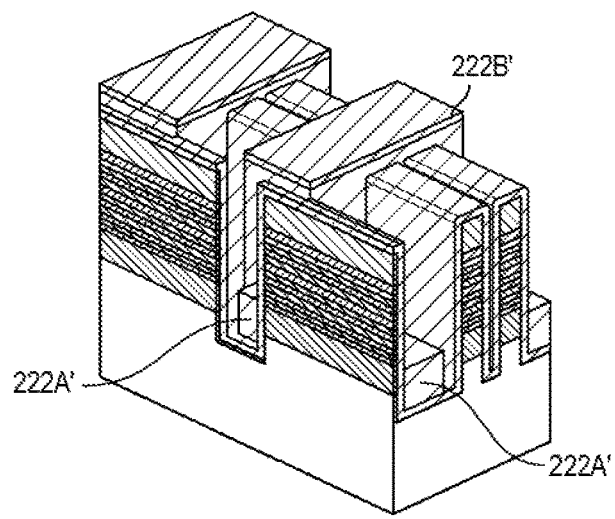
Figure 2E:
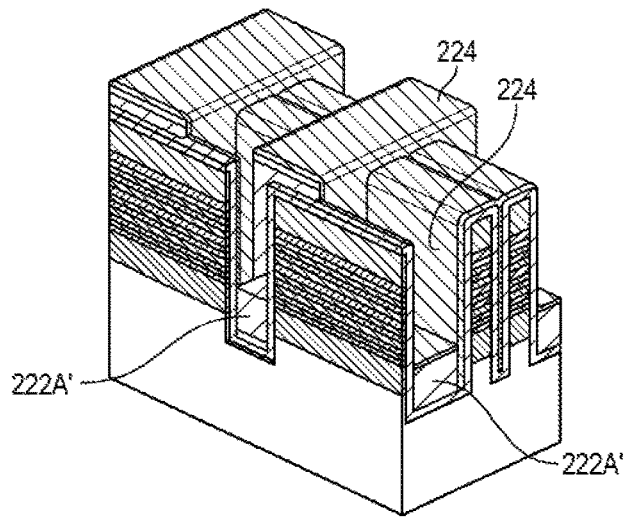

Referring to FIG. 2D, the grating mask 222C is used in an etch process to pattern the dielectric cap 222B and to recess the sacrificial hardmask material 222A to form patterned dielectric cap 222B' and patterned sacrificial hardmask material 222A', and the grating mask 222C is then removed. A liner 224, such as a titanium nitride liner, is them formed on the structure of FIG. 2D, as is depicted in FIG. 2E.

Figure 2F:
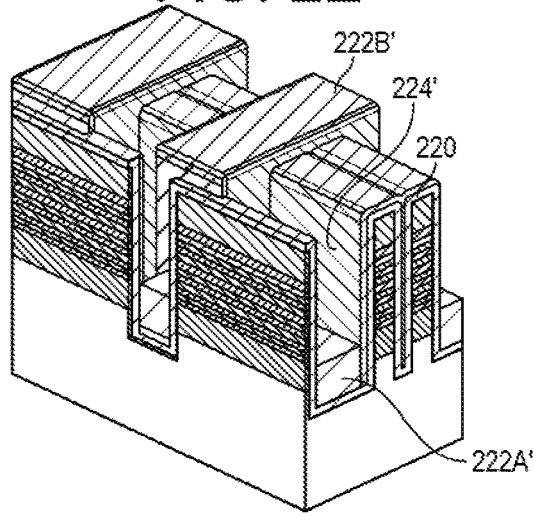
Figure 2G:
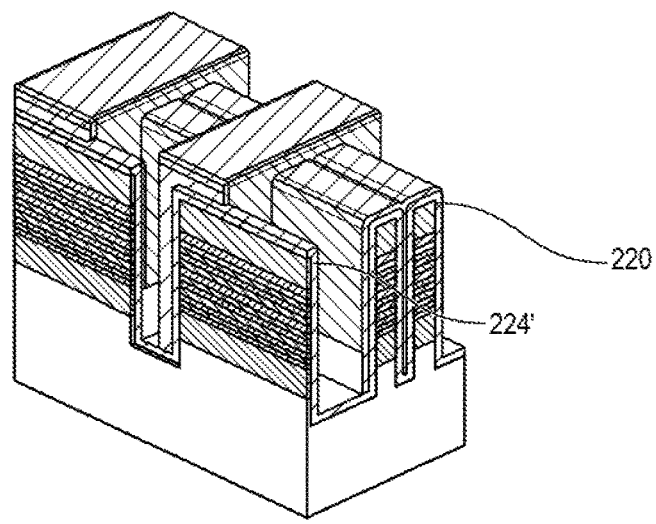

Referring to FIG. 2F, a liner break-through etch of liner 224, such as a titanium nitride liner break-through etch, is used to form patterned liner 224'. Using the patterned liner 224' as a mask, the patterned sacrificial hardmask material 222A' is then removed, as is depicted in FIG. 2G.

Figure 2H:
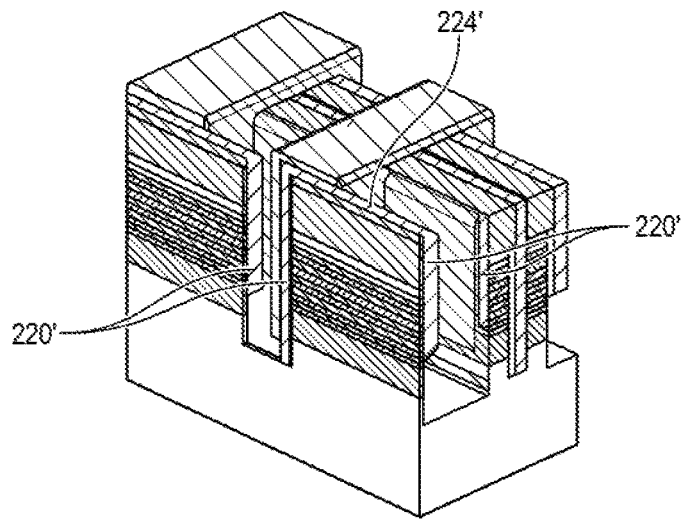

Referring to FIG. 2H, using the patterned liner 224' as a mask, the spacer dielectric 220 is etched to form patterned spacer dielectric 220'. Lowermost release or sacrificial layer 208 is selectively removed from the structure of FIG. 2H, e.g., by a selective wet etch process, to form a modified fin stack 204' above cavities 230, as is depicted in FIG. 2I.

Figure 2I:
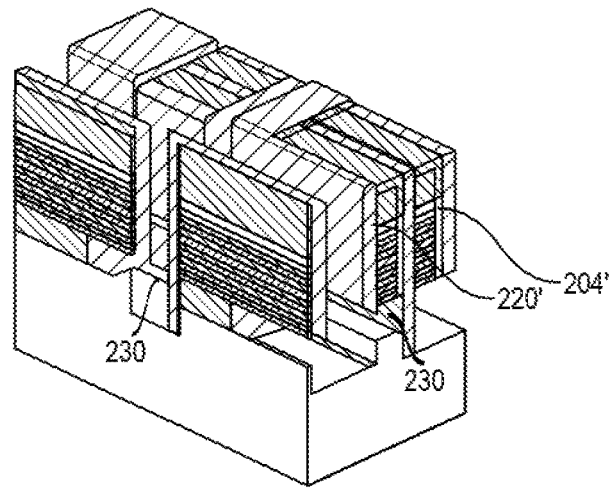
Figure 2J:
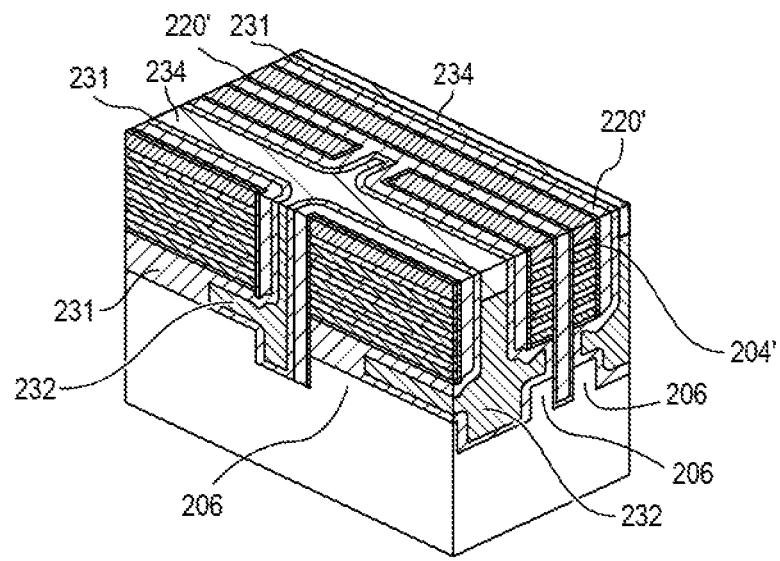
Figure 2K:
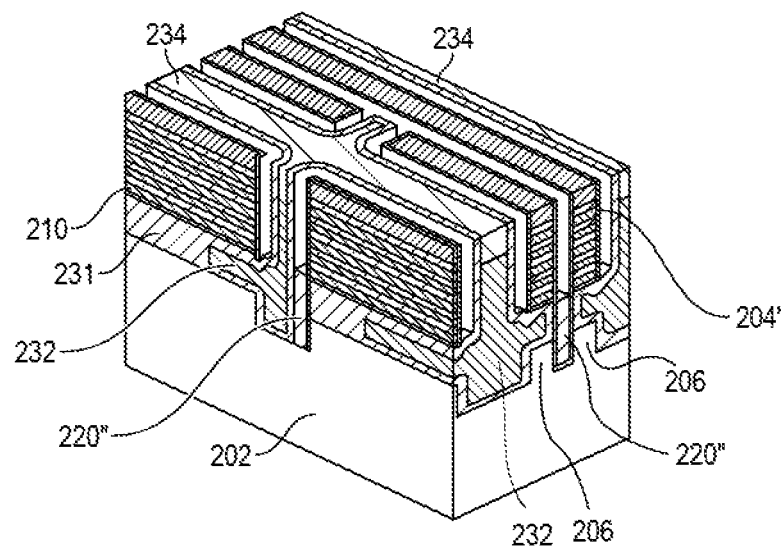

Referring to FIG. 2J, dielectric materials 231, 232 and 234 are successively formed in the openings of the structure of FIG. 2I. The patterned spacer dielectric 220' is then removed and/or recessed to formed twice patterned spacer dielectric 220", as is depicted in FIG. 2K. The remaining twice patterned spacer dielectric 220" and the dielectric materials 231, 232 and 234 collectively provide a fin stack isolation structure and a self-aligned gate endcap (SAGE) wall.

At this stage, with modified fin stack 204' isolated from sub-fin structure 206, subsequent processing can include removal of remaining dielectric liners from the modified fin stack 204', release of nanowires from the modified fin stack 204', and formation of gate structures over the resulting nanowires and adjacent SAGE walls, exemplary processes for which are described below.

With reference again to FIG. 2K, in accordance with an embodiment of the present disclosure, an integrated circuit structure includes a sub-fin structure 206 on a substrate 202, the sub-fin structure 206 having a top and sidewalls. An isolation structure (formed from portions of 231, 232, 220") is on the top and along the sidewalls of the sub-fin structure 206. A vertical arrangement of horizontal nanowires 210 is on the isolation structure and vertically over the top surface of the sub-fin structure 206. A gate endcap structure (formed from portions of 232 and 234) is parallel with the vertical arrangement of horizontal nanowires 210. A portion of the gate endcap structure is continuous with a portion of the isolation structure vertically between the sub-fin structure 206 and the vertical arrangement of horizontal nanowires 210.

In an embodiment, the gate endcap structure includes an upper portion 234 on the portion 232 of the gate endcap structure continuous with the portion 232 of the isolation structure vertically between the sub-fin structure 206 and the vertical arrangement of horizontal nanowires 210. In an embodiment, a portion 220" of the isolation structure along a first of the sidewalls of the sub-fin structure 206 is discontinuous with a portion 232 of the isolation structure along a second of the sidewalls of the sub-fin structure 206.

In an embodiment, the integrated circuit structure further includes a gate stack surrounding a channel region of the vertical arrangement of horizontal nanowires 210, exemplary structures of which are described in greater detail below. In one such embodiment, the gate stack includes a high-k gate dielectric layer and a metal gate electrode.

In an embodiment, the integrated circuit structure further includes a pair of non-discrete epitaxial source or drain structures at first and second ends of the vertical arrangement of horizontal nanowires 210, exemplary structures of which are described in greater detail below. In another embodiment, the integrated circuit structure further includes a pair of discrete epitaxial source or drain structures at first and second ends of the vertical arrangement of horizontal nanowires 210, exemplary structures of which are described in greater detail below.

Figure 3:
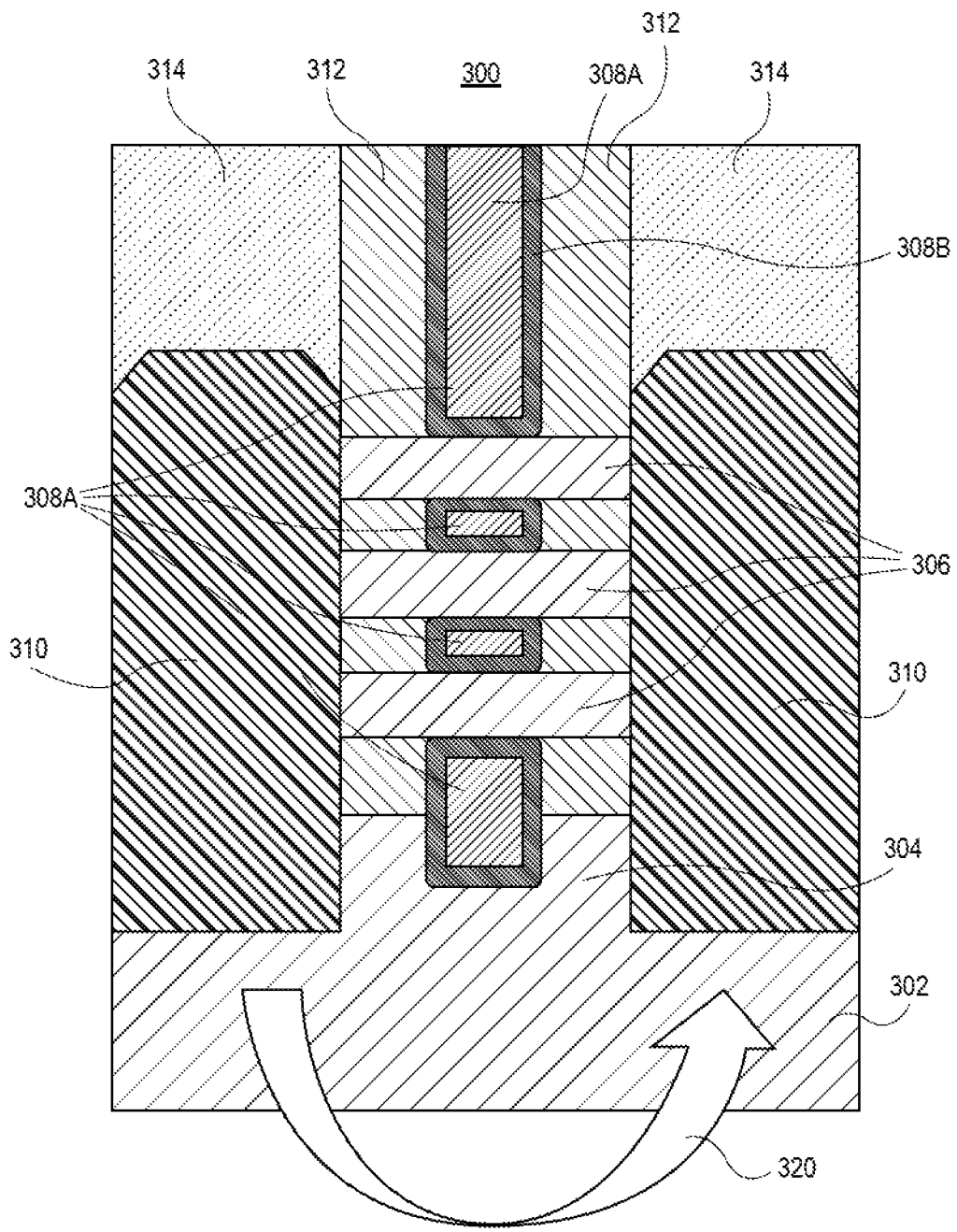
FIG. 3 illustrates a cross-sectional view of a comparative gate-all-around integrated circuit structure.

As an exemplary device without fin stack isolation, FIG. 3 illustrates a cross-sectional view of a comparative gate-all-around integrated circuit structure.

Referring to FIG. 3, an integrated circuit structure 300 includes a semiconductor substrate 302 having a fin 304 protruding therefrom. The substrate 302 may be a bulk silicon substrate, and the fin 304 may be a sub-fin structure of a nanowire or nanoribbon device. Nanowires or nanoribbons 306 are above the fin 304 and may be stacked as a vertical arrangement of horizontal nanowires or nanoribbons, as is depicted. A gate stack 308 surrounds channel regions of the nanowires or nanoribbons 306. The gate stack includes a gate electrode 308A and a gate dielectric layer 308B. Source or drain structures 310 are on either side of the gate stack 308. A pair of dielectric spacers 312 is between the source or drain structures 310 and the gate stack 308. Source or drain contacts 314 are on the source or drain structures 310.

The integrated circuit structure 300 may have an associated substrate 302 or sub-fin 304 leakage path 320 from source to drain (e.g., from left-side 312 to right-side 312). The leakage path 320 may be a parasitic conduction path and lead to relatively poor device characteristics.

Figure 4:
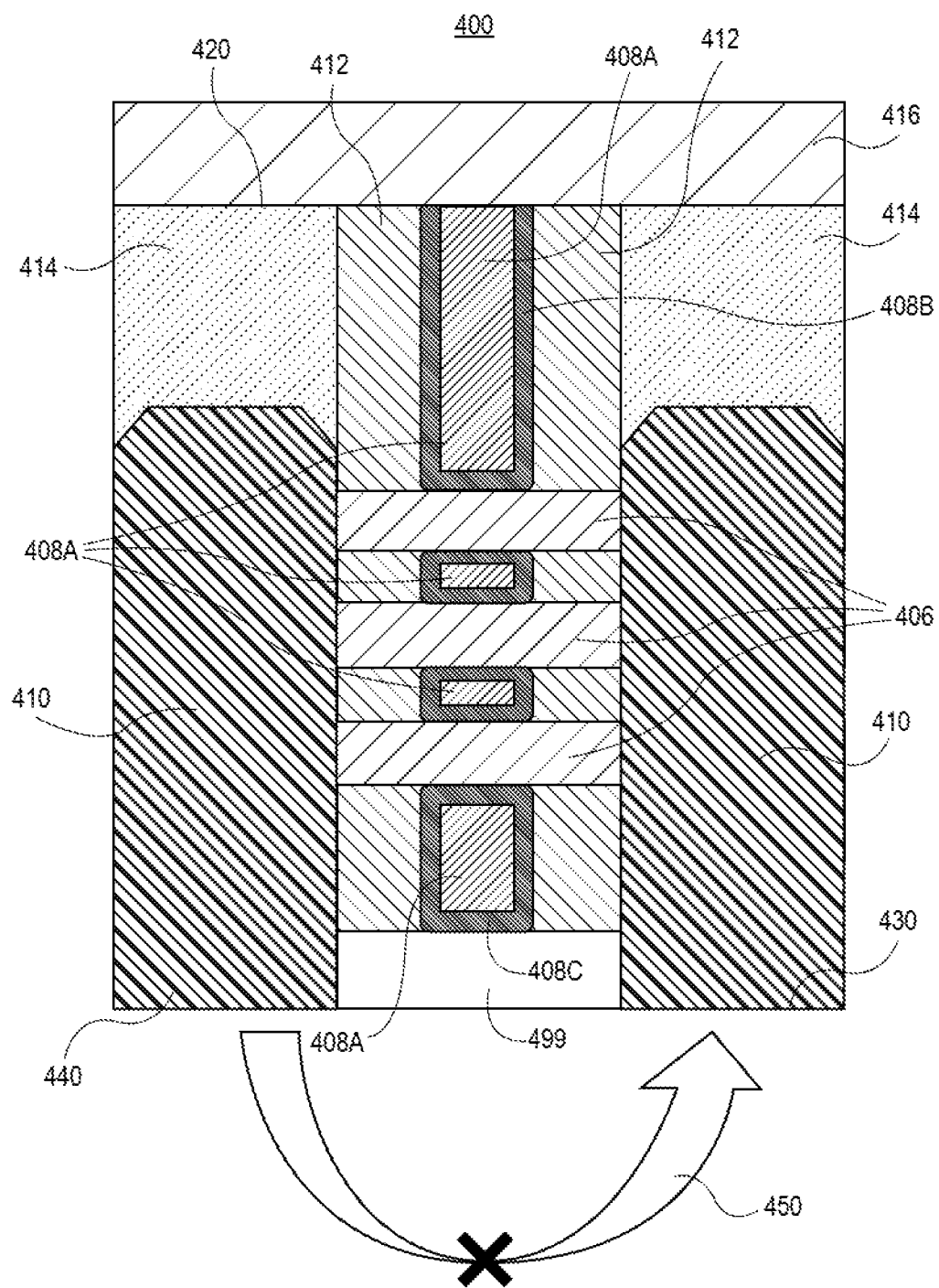
FIG. 4 illustrates a cross-sectional view of a gate-all-around integrated circuit structure having fin stack isolation, in accordance with an embodiment of the present disclosure.

By contrast, as an exemplary device having fin stack isolation, FIG. 4 illustrates a cross-sectional view of a gate-all-around integrated circuit structure having fin stack isolation, in accordance with an embodiment of the present disclosure.

Referring to FIG. 4, an integrated circuit structure 400 includes a vertical arrangement of horizontal nanowires 406 above a local isolation structure 499. In one embodiment, the local isolation structure 499 is fabricated according to a method such as described in association with FIG. 1A-1Q or 2A-2K. A gate stack 408A/408B surrounds a channel region of the vertical arrangement of horizontal nanowires 406 and may or may not be beneath the bottommost nanowire. A pair of non-discrete epitaxial source or drain structures 410 is at first and second ends of the vertical arrangement of horizontal nanowires 406. A pair of dielectric spacers 412 is between the pair of non-discrete epitaxial source or drain structures 410 and the gate stack 408A/408B. In one embodiment, the pair of dielectric spacers 412 and the gate stack 408A/408B have co-planar top surfaces, e.g., at surface 420. In one embodiment, the pair of dielectric spacers 412, the local isolation structure 499 and the pair of non-discrete epitaxial source or drain structures 410 have co-planar bottom surfaces, e.g., at surface 430.

In an embodiment, the inclusion of local isolation structure 499 blocks or eliminates a parasitic conduction path (e.g., from source 410 to drain 410) for improved device performance. That is, integrated circuit structure 400 may be associated with little to no sub-fin or substrate leakage path 450.

In an embodiment, one or both of the pair of non-discrete epitaxial source or drain structures 410 has a dielectric material thereon (represented by 414 in one embodiment). In one such embodiment, the dielectric material 414, the pair of dielectric spacers 412 and the gate stack 408A/408B have co-planar top surfaces, as is depicted at surface 420. In an embodiment, a dielectric layer or etch stop layer 416 is on the surface 420.

In an embodiment, one or both of the pair of non-discrete epitaxial source or drain structures 410 has a top conductive contact thereon (represented by 414 in one embodiment). In one such embodiment, wherein the top conductive contact 414, the pair of dielectric spacers 412 and the gate stack 408A/408B have co-planar top surfaces, as is depicted at surface 420. In an embodiment, one or both of the pair of non-discrete epitaxial source or drain structures 410 has a bottom conductive contact thereon, e.g., at one or both of locations 440. In an embodiment, the gate stack 408A/408B includes a high-k gate dielectric layer 408B and a metal gate electrode 408A. In one such embodiment, a bottom surface of the metal gate electrode 408A has the high-k gate dielectric layer 408B thereon, e.g., at location 408C.

It is to be appreciated that, in a particular embodiment, channel layers of nanowires (or nanoribbons) may be composed of silicon. Alternatively, nanowire release or sacrificial layers may be composed of silicon. In either case, as used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, channel layers of nanowires (or nanoribbons) may be composed of silicon germanium. Alternatively, nanowire release or sacrificial layers may be composed of silicon germanium. In either case, as used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

It is to be appreciated that, in a particular embodiment, channel layers of nanowires (or nanoribbons) may be composed of germanium. Alternatively, nanowire release or sacrificial layers may be composed of germanium. In either case, as used throughout, a germanium layer may be used to describe a germanium material composed of a very substantial amount of, if not all, germanium. However, it is to be appreciated that, practically, 100% pure Ge may be difficult to form and, hence, could include a tiny percentage of carbon, silicon or tin. Such impurities may be included as an unavoidable impurity or component during deposition of Ge or may "contaminate" the Ge upon diffusion during post deposition processing. As such, embodiments described herein directed to a germanium layer may include a germanium layer that contains a relatively small amount, e.g., "impurity" level, non-Ge atoms or species, such as Si, C or Sn. It is to be appreciated that a silicon layer as described herein may be undoped or may be doped with dopant atoms such as boron, phosphorous or arsenic.

It is to be appreciated that the embodiments described herein can also include other implementations such as nanowires and/or nanoribbons with various widths, thicknesses and/or materials including but not limited to Si, Ge, SiGe and/or group III-V materials. Described below are various devices and processing schemes that may be used to fabricate a device with a removed semiconductor substrate. It is to be appreciated that the exemplary embodiments need not necessarily require all features described, or may include more features than are described.

In another aspect, nanowire release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

In another aspect, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a possible completed device, FIG. 5 illustrates a cross-sectional view of a non-planar integrated circuit structure as taken along a gate line, in accordance with an embodiment of the present disclosure.

Figure 5:
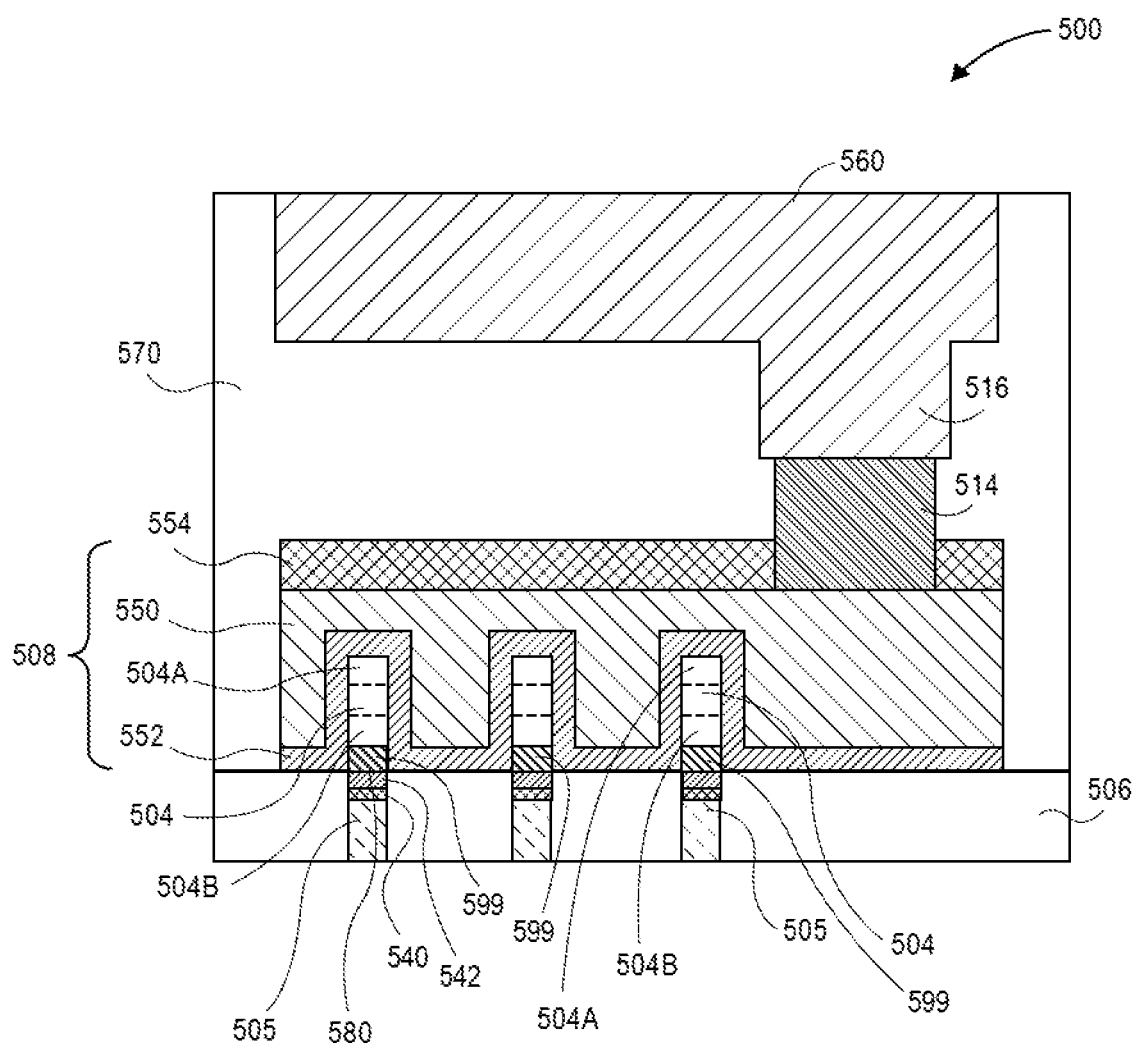
FIG. 5 illustrates a cross-sectional view of a non-planar integrated circuit structure as taken along a gate line, in accordance with an embodiment of the present disclosure.

Referring to FIG. 5, a semiconductor structure or device 500 includes a non-planar active region (e.g., a fin structure including protruding fin portion 504 and sub-fin region 505) within a trench isolation region 506. In an embodiment, instead of a solid fin, the non-planar active region is separated into nanowires (such as nanowires 504A and 504B) above sub-fin region 505, as is represented by the dashed lines. In either case, for ease of description for non-planar integrated circuit structure 500, a non-planar active region 504 is referenced below as a protruding fin portion. In an embodiment, a local isolation structure 599 isolates the nanowires 504A and 504B from the sub-fin region 505, as is depicted. In one embodiment, the local isolation structure 599 is fabricated according to a method such as described in association with FIG. 1A-1Q or 2A-2K. In an embodiment, the sub-fin region 505 includes growth enhancement layers such as a relaxed buffer layer 542 and a defect modification layer 540, as is depicted.

A gate line 508 is disposed over the protruding portions 504 of the non-planar active region (including, if applicable, surrounding nanowires 504A and 504B), as well as over a portion of the trench isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5, the gate contact 514 is, in one embodiment, disposed over trench isolation region 506, but not over the non-planar active regions. In another embodiment, the gate contact 514 is over the non-planar active regions.

In an embodiment, the semiconductor structure or device 500 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body.

As is also depicted in FIG. 5, in an embodiment, an interface 580 exists between a protruding fin portion 504 and sub-fin region 505. The interface 580 can be a transition region between a doped sub-fin region 505 and a lightly or undoped upper fin portion 504. In one such embodiment, each fin is approximately 10 nanometers wide or less, and sub-fin dopants are optionally supplied from an adjacent solid state doping layer at the sub-fin location. In a particular such embodiment, each fin is less than 10 nanometers wide.

Although not depicted in FIG. 5, it is to be appreciated that source or drain regions of or adjacent to the protruding fin portions 504 are on either side of the gate line 508, i.e., into and out of the page. In one embodiment, the material of the protruding fin portions 504 in the source or drain locations is removed and replaced with another semiconductor material, e.g., by epitaxial deposition to form epitaxial source or drain structures. The source or drain regions may extend below the height of dielectric layer of trench isolation region 506, i.e., into the sub-fin region 505. In accordance with an embodiment of the present disclosure, the more heavily doped sub-fin regions, i.e., the doped portions of the fins below interface 580, inhibits source to drain leakage through this portion of the bulk semiconductor fins.

With reference again to FIG. 5, in an embodiment, fins 504/505 (and, possibly nanowires 504A and 504B) are composed of a crystalline silicon germanium layer which may be doped with a charge carrier, such as but not limited to phosphorus, arsenic, boron, gallium or a combination thereof.

In an embodiment, trench isolation region 506, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region 506 is composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer 552 is composed of a high-k material. For example, in one embodiment, the gate dielectric layer 552 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 552 may include a layer of native oxide formed from the top few layers of the substrate fin 504. In an embodiment, the gate dielectric layer 552 is composed of a top high-k portion and a lower portion composed of an oxide of a semiconductor material. In one embodiment, the gate dielectric layer 552 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer 550 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 550 is composed of a non-workfunction-setting fill material formed above a metal workfunction-setting layer. The gate electrode layer 550 may consist of a P-type workfunction metal or an N-type workfunction metal, depending on whether the transistor is to be a PMOS or an NMOS transistor. In some implementations, the gate electrode layer 550 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode layer 550 may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode layer 550 may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 508 is formed while eliminating the use of a lithographic step with exceedingly tight registration budget. In an embodiment, the contact pattern is a vertically symmetric contact pattern, or an asymmetric contact pattern. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 500 involves fabrication of the gate stack structure 508 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 5, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region, e.g., over a fin 505, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, dielectric liners or dielectric caps are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

Figure 7:
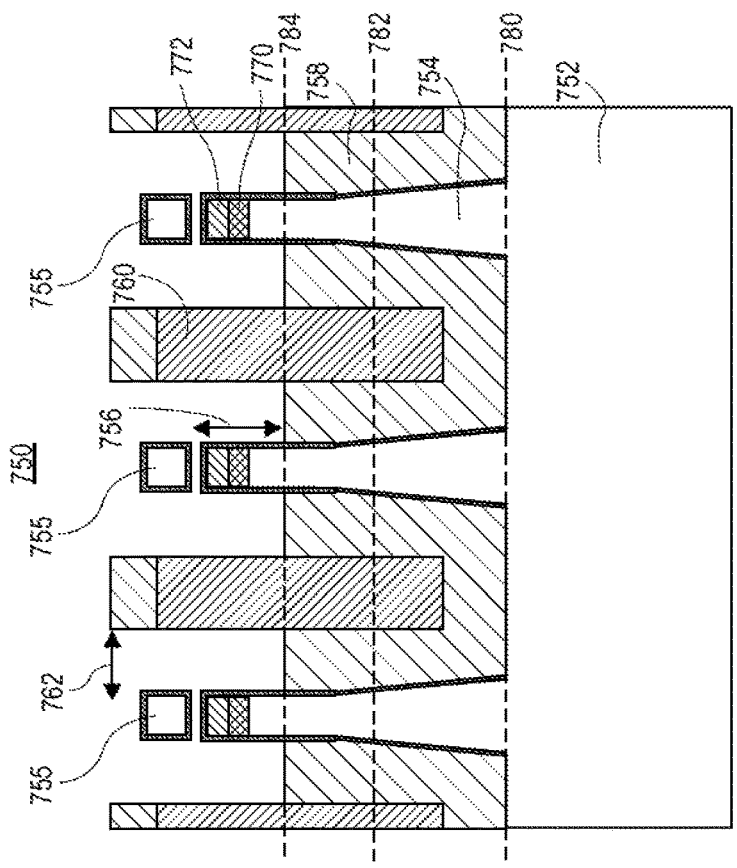
FIG. 7 illustrates a cross-sectional view taken through nanowires and fins for a self-aligned gate endcap (SAGE) architecture, in accordance with an embodiment of the present disclosure.
Figure 6:
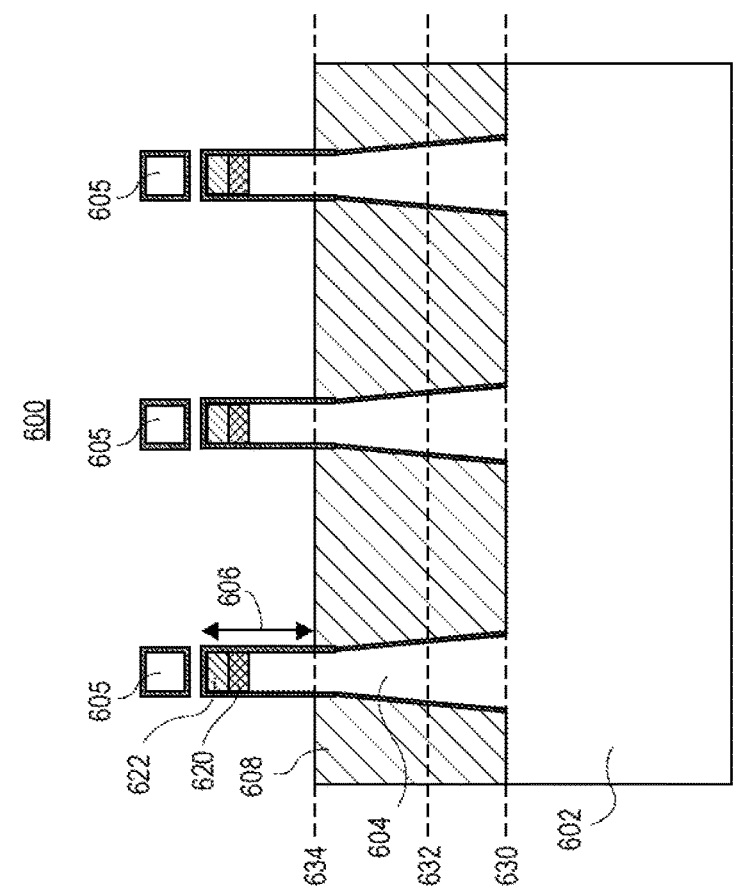
FIG. 6 illustrates a cross-sectional view taken through nanowires and fins for a non-endcap architecture, in accordance with an embodiment of the present disclosure.

To provide further context, advantages of a self-aligned gate endcap (SAGE) architecture may include the enabling of higher layout density and, in particular, scaling of diffusion to diffusion spacing. To provide illustrative comparison, FIG. 6 illustrates a cross-sectional view taken through nanowires and fins for a non-endcap architecture, in accordance with an embodiment of the present disclosure. FIG. 7 illustrates a cross-sectional view taken through nanowires and fins for a self-aligned gate endcap (SAGE) architecture, in accordance with an embodiment of the present disclosure.

Referring to FIG. 6, an integrated circuit structure 600 includes a substrate 602 having fins 604 protruding there from by an amount 606 above an isolation structure 608 laterally surrounding lower portions of the fins 604. Upper portions of the fins may include a local isolation structure 622 (such as described in association with FIG. 1A-1Q or 2A-2K) and a growth enhancement layer 620, as is depicted. Corresponding nanowires 605 are over the fins 604. A gate structure may be formed over the integrated circuit structure 600 to fabricate a device. However, breaks in such a gate structure may be accommodated for by increasing the spacing between fin 604/nanowire 605 pairs.

Referring to FIG. 6, in an embodiment, following gate formation, the lower portions of the structure 600 can be planarized and/or etched to level 634 in order to leave a backside surface including exposed bottom surfaces of gate structures and epitaxial source or drain structures. It is to be appreciated that backside (bottom) contacts may be formed on the exposed bottom surfaces of the epitaxial source or drain structures. It is also to be appreciated that planarization and/or etching could be to other levels such as 630 or 632.

By contrast, referring to FIG. 7, an integrated circuit structure 750 includes a substrate 752 having fins 754 protruding therefrom by an amount 756 above an isolation structure 758 laterally surrounding lower portions of the fins 754. Upper portions of the fins may include a local isolation structure 772 (such as described in association with FIG. 1A-1Q or 2A-2K) and a growth enhancement layer 770, as is depicted. Corresponding nanowires 755 are over the fins 754. Isolating SAGE walls 760 (which may include a hardmask thereon, as depicted) are included within the isolation structure 758 and between adjacent fin 754/nanowire 755 pairs. The distance between an isolating SAGE wall 760 and a nearest fin 754/nanowire 755 pair defines the gate endcap spacing 762. A gate structure may be formed over the integrated circuit structure 750, between insolating SAGE walls to fabricate a device. Breaks in such a gate structure are imposed by the isolating SAGE walls. Since the isolating SAGE walls 760 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 760. In an embodiment, as depicted, the isolating SAGE walls 760 each include a lower dielectric portion and a dielectric cap on the lower dielectric portion.

Referring to FIG. 7, in an embodiment, following gate formation, the lower portions of the structure 700 can be planarized and/or etched to level 784 in order to leave a backside surface including exposed bottom surfaces of gate structures and epitaxial source or drain structures. It is to be appreciated that backside (bottom) contacts may be formed on the exposed bottom surfaces of the epitaxial source or drain structures. It is also to be appreciated that planarization and/or etching could be to other levels such as 780 or 782.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an embodiment, as described throughout, self-aligned gate endcap (SAGE) isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along an a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. In an embodiment, as depicted, a local isolation structure 802C, a growth enhancement layer 802B, and a lower substrate portion 802A are included in substrate 802, as is depicted. An optional fin below the bottommost nanowire and formed from the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. That is, the non-discrete source or drain regions 810/812 are global in the sense that a single unified feature is used as a source or drain region for a plurality (in this case, 3) of nanowires 804 and, more particularly, for more than one discrete channel region 806. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nanowires are relatively larger yet discrete non-vertically merged epitaxial structures such as nubs.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxy-nitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIG. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbons as described throughout.

Referring again to FIGS. 8A, 8B and 8C, in an embodiment, the lower portions of the structure 800 can be planarized and/or etched to level 899 in order to leave a backside surface including exposed bottom surfaces of gate structures and epitaxial source or drain structures. It is to be appreciated that backside (bottom) contacts may be formed on the exposed bottom surfaces of the epitaxial source or drain structures.

In an embodiment, as described throughout, an integrated circuit structure includes non-planar devices such as, but not limited to, a finFET or a tri-gate structure with corresponding one or more overlying nanowire structures, and an isolation structure between the finFET or tri-gate structure and the corresponding one or more overlying nanowire structures. In some embodiments, the finFET or tri-gate structure is retained. In other embodiments, the finFET or tri-gate structure is may ultimately be removed in a substrate removal process.

In an embodiment, as described throughout, an underlying substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron, gallium or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
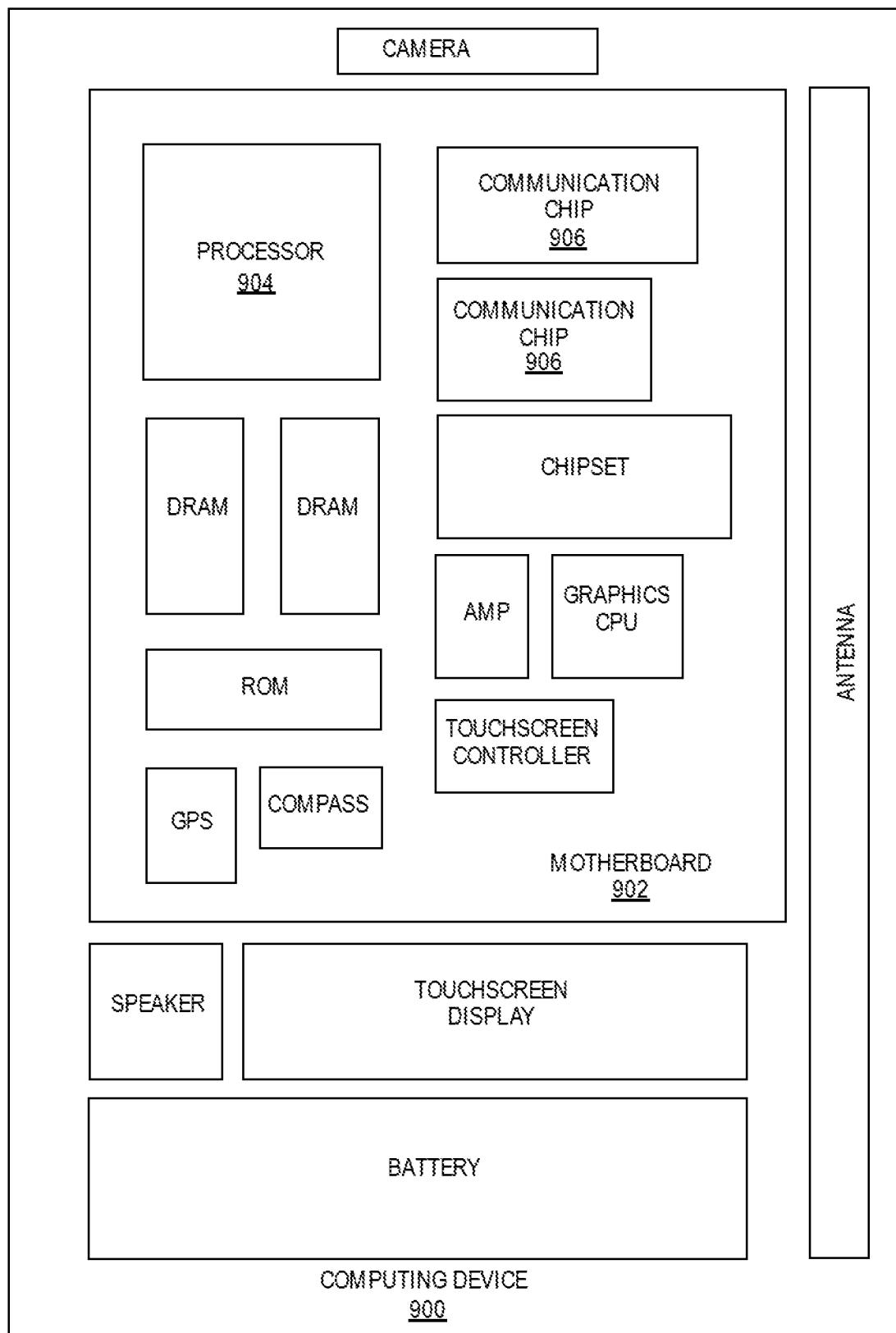
FIG. 9 illustrates a computing device in accordance with one implementation of an embodiment of the disclosure.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as gate-all-around integrated circuit structures having fin stack isolation, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as gate-all-around integrated circuit structures having fin stack isolation, built in accordance with implementations of embodiments of the present disclosure.

In further implementations, another component housed within the computing device 900 may contain an integrated circuit die that includes one or structures, such as gate-all-around integrated circuit structures having fin stack isolation, built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
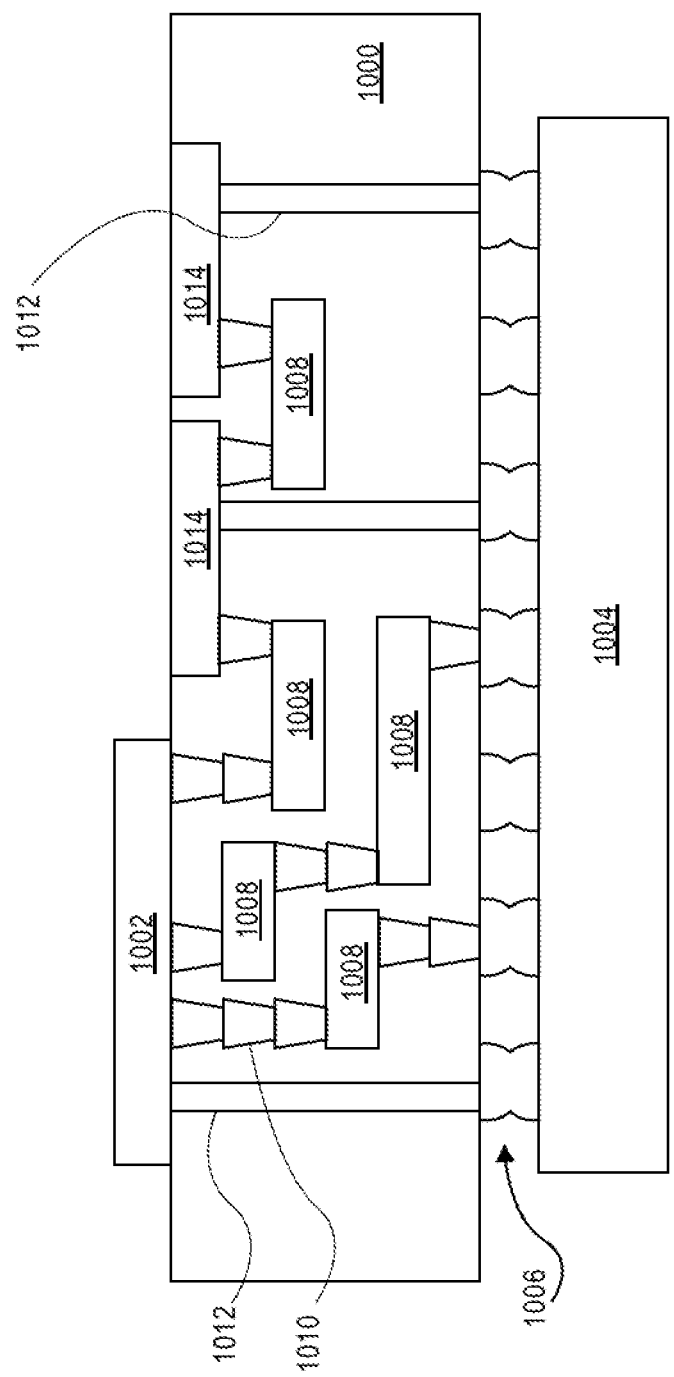
FIG. 10 illustrates an interposer that includes one or more embodiments of the disclosure.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Thus, embodiments of the present disclosure include gate-all-around integrated circuit structures having fin stack isolation, and methods of fabricating gate-all-around integrated circuit structures having fin stack isolation.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a sub-fin structure on a substrate, the sub-fin structure having a top and sidewalls. An isolation structure is on the top and along the sidewalls of the sub-fin structure. The isolation structure includes a first dielectric material surrounding regions of a second dielectric material. A vertical arrangement of horizontal nanowires is on a portion of the isolation structure on the top surface of the sub-fin structure.

Example Embodiment 2

The integrated circuit structure of example embodiment 1, wherein a portion of the isolation structure along the sidewalls of the sub-fin structure has a top surface co-planar with a top surface of the portion of the isolation structure on the top surface of the sub-fin structure.

Example Embodiment 3

The integrated circuit structure of example embodiment 1, wherein a portion of the isolation structure along the sidewalls of the sub-fin structure has a top surface above a top surface of the portion of the isolation structure on the top surface of the sub-fin structure.

Example Embodiment 4

The integrated circuit structure of example embodiment 1, wherein a portion of the isolation structure along the sidewalls of the sub-fin structure has a top surface below a top surface of the portion of the isolation structure on the top surface of the sub-fin structure.

Example Embodiment 5

The integrated circuit structure of example embodiment 1, 2, 3 or 4, further including a gate stack surrounding a channel region of the vertical arrangement of horizontal nanowires.

Example Embodiment 6

The integrated circuit structure of example embodiment 5, wherein the gate stack includes a high-k gate dielectric layer and a metal gate electrode.

Example Embodiment 7

The integrated circuit structure of example embodiment 1, 2, 3, 4, 5 or 6, further including a pair of non-discrete epitaxial source or drain structures at first and second ends of the vertical arrangement of horizontal nanowires.

Example Embodiment 8

The integrated circuit structure of example embodiment 1, 2, 3, 4, 5 or 6, further including a pair of discrete epitaxial source or drain structures at first and second ends of the vertical arrangement of horizontal nanowires.

Example Embodiment 9

A computing device includes a board, and a component coupled to the board. The component includes an integrated circuit structure including a sub-fin structure on a substrate, the sub-fin structure having a top and sidewalls. An isolation structure is on the top and along the sidewalls of the sub-fin structure. The isolation structure includes a first dielectric material surrounding regions of a second dielectric material. A vertical arrangement of horizontal nanowires is on a portion of the isolation structure on the top surface of the sub-fin structure.

Example Embodiment 10

The computing device of example embodiment 9, further including a memory coupled to the board.

Example Embodiment 11

The computing device of example embodiment 9 or 10, further including a communication chip coupled to the board.

Example Embodiment 12

The computing device of example embodiment 9, 10 or 11, wherein the component is a packaged integrated circuit die.

Example Embodiment 13

The computing device of example embodiment 9, 10, 11 or 12, wherein the component is selected from the group consisting of a processor, a communications chip, and a digital signal processor.

Example Embodiment 14

An integrated circuit structure includes a sub-fin structure on a substrate, the sub-fin structure having a top and sidewalls. An isolation structure is on the top and along the sidewalls of the sub-fin structure. A vertical arrangement of horizontal nanowires is on the isolation structure and vertically over the top surface of the sub-fin structure. A gate endcap structure is parallel with the vertical arrangement of horizontal nanowires. A portion of the gate endcap structure is continuous with a portion of the isolation structure vertically between the sub-fin structure and the vertical arrangement of horizontal nanowires.

Example Embodiment 15

The integrated circuit structure of example embodiment 14, wherein the gate endcap structure includes an upper portion on the portion of the gate endcap structure continuous with the portion of the isolation structure vertically between the sub-fin structure and the vertical arrangement of horizontal nanowires.

Example Embodiment 16

The integrated circuit structure of example embodiment 14 or 15, wherein a portion of the isolation structure along a first of the sidewalls of the sub-fin structure is discontinuous with a portion of the isolation structure along a second of the sidewalls of the sub-fin structure.

Example Embodiment 17

The integrated circuit structure of example embodiment 14, 15 or 16, further including a gate stack surrounding a channel region of the vertical arrangement of horizontal nanowires.

Example Embodiment 18

The integrated circuit structure of example embodiment 17, wherein the gate stack includes a high-k gate dielectric layer and a metal gate electrode.

Example Embodiment 19

The integrated circuit structure of example embodiment 14, 15, 16, 17 or 18, further including a pair of non-discrete epitaxial source or drain structures at first and second ends of the vertical arrangement of horizontal nanowires.

Example Embodiment 20

The integrated circuit structure of example embodiment 14, 15, 16, 17 or 18, further including a pair of discrete epitaxial source or drain structures at first and second ends of the vertical arrangement of horizontal nanowires.

Example Embodiment 21

A computing device includes a board, and a component coupled to the board. The component includes an integrated circuit structure including a sub-fin structure on a substrate, the sub-fin structure having a top and sidewalls. An isolation structure is on the top and along the sidewalls of the sub-fin structure. A vertical arrangement of horizontal nanowires is on the isolation structure and vertically over the top surface of the sub-fin structure. A gate endcap structure is parallel with the vertical arrangement of horizontal nanowires. A portion of the gate endcap structure is continuous with a portion of the isolation structure vertically between the sub-fin structure and the vertical arrangement of horizontal nanowires.

Example Embodiment 22

The computing device of example embodiment 21, further including a memory coupled to the board.

Example Embodiment 23

The computing device of example embodiment 21 or 22, further including a communication chip coupled to the board.

Example Embodiment 24

The computing device of example embodiment 21, 22 or 23, wherein the component is a packaged integrated circuit die.

Example Embodiment 25

The computing device of example embodiment 21, 22, 23 or 24, wherein the component is selected from the group consisting of a processor, a communications chip, and a digital signal processor.

What is claimed is:

1. An integrated circuit structure, comprising:
   a sub-fin structure on a substrate, the sub-fin structure having a top and sidewalls;
   an isolation structure on the top and along the sidewalls of the sub-fin structure, wherein the isolation structure comprises a first dielectric material surrounding regions of a second dielectric material, the first dielectric material completely vertically overlapping the second dielectric material, and the first dielectric material in direct contact with the sidewalls and the top of the sub-fin structure; and
   a vertical arrangement of horizontal nanowires on a portion of the isolation structure on the top surface of the sub-fin structure.

2. The integrated circuit structure of claim 1, wherein a portion of the isolation structure along the sidewalls of the sub-fin structure has a top surface co-planar with a top surface of the portion of the isolation structure on the top surface of the sub-fin structure.

3. The integrated circuit structure of claim 1, wherein a portion of the isolation structure along the sidewalls of the sub-fin structure has a top surface above a top surface of the portion of the isolation structure on the top surface of the sub-fin structure.

4. The integrated circuit structure of claim 1, wherein a portion of the isolation structure along the sidewalls of the sub-fin structure has a top surface below a top surface of the portion of the isolation structure on the top surface of the sub-fin structure.

5. The integrated circuit structure of claim 1, further comprising:
   a gate stack surrounding a channel region of the vertical arrangement of horizontal nanowires.

6. The integrated circuit structure of claim 5, wherein the gate stack comprises a high-k gate dielectric layer and a metal gate electrode.

7. The integrated circuit structure of claim 1, further comprising:
   a pair of non-discrete epitaxial source or drain structures at first and second ends of the vertical arrangement of horizontal nanowires.

8. The integrated circuit structure of claim 1, further comprising:
   a pair of discrete epitaxial source or drain structures at first and second ends of the vertical arrangement of horizontal nanowires.

9. A computing device, comprising:
   a board; and
   a component coupled to the board, the component including an integrated circuit structure, comprising:
      a sub-fin structure on a substrate, the sub-fin structure having a top and sidewalls;
      an isolation structure on the top and along the sidewalls of the sub-fin structure, wherein the isolation structure comprises a first dielectric material surrounding regions of a second dielectric material, the first dielectric material completely vertically overlapping the second dielectric material, and the first dielectric material in direct contact with the sidewalls and the top of the sub-fin structure; and
      a vertical arrangement of horizontal nanowires on a portion of the isolation structure on the top surface of the sub-fin structure.

10. The computing device of claim 9, further comprising:
   a memory coupled to the board.

11. The computing device of claim 9, further comprising:
a communication chip coupled to the board.

12. The computing device of claim 9, wherein the component is a packaged integrated circuit die.

13. The computing device of claim 9, wherein the component is selected from the group consisting of a processor, a communications chip, and a digital signal processor.

* * * * *